United States Patent
Cho et al.

(10) Patent No.: US 7,421,164 B2
(45) Date of Patent: Sep. 2, 2008

(54) METHOD FOR FABRICATING LASER DIODE HAVING OPTICAL FIBER BRAGG GRATING AS FRONT MIRROR OF EXTERNAL RESONATOR AND LASER DIODE FABRICATED THEREBY

(75) Inventors: Seung Hyun Cho, Daejeon (KR); Woo Ram Lee, Daejeon (KR); Jae Dong Park, Ottawa (CA); Byoung Whi Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 351 days.

(21) Appl. No.: 11/296,817

(22) Filed: Dec. 7, 2005

(65) Prior Publication Data

US 2006/0133729 A1 Jun. 22, 2006

(30) Foreign Application Priority Data

Dec. 20, 2004 (KR) ...................... 10-2004-0108919

(51) Int. Cl.
*G02B 6/36* (2006.01)
(52) U.S. Cl. ............................. 385/37; 385/88; 372/102
(58) Field of Classification Search .................. 385/37, 385/88; 372/92, 36
See application file for complete search history.

(56) References Cited

U.S. PATENT DOCUMENTS 5,717,711 A * 2/1998 Doussiere et al. ............. 385/37
6,273,620 B1 * 8/2001 Kato et al. ..................... 385/88
6,310,997 B1 * 10/2001 Kato et al. ..................... 385/37
6,366,396 B1 * 4/2002 Hayashi ...................... 359/344
6,415,078 B1 * 7/2002 Shigehara et al. .............. 385/37
6,647,038 B2 * 11/2003 Althaus et al. ................. 372/36
6,665,323 B2   12/2003 Fujita
6,707,832 B2   3/2004 Minden
6,805,492 B2 * 10/2004 Hashimoto et al. ............ 385/88
6,819,700 B2 * 11/2004 Kato et al. ..................... 372/92
7,059,780 B2 * 6/2006 Yamabayashi et al. ......... 385/88

FOREIGN PATENT DOCUMENTS

| KR | 20010080687 | 8/2001 |
| KR | 100388355 | 2/2002 |
| KR | 20020036015 | 5/2002 |
| WO | WO 0003461 | 1/2000 |

* cited by examiner

*Primary Examiner*—Quyen P Leung
(74) *Attorney, Agent, or Firm*—Ladas & Parry LLP

(57) ABSTRACT

A method for fabricating a laser includes preparing an optical fiber including the optical fiber Bragg grating formed at a region thereof, and a ferrule provided with a cylindrical free space penetrating both ends thereof; applying a first thermal epoxy resin to a partial region of the outer cylindrical surface of the other region of the optical fiber, at which the optical fiber Bragg grating is not formed; inserting the optical fiber into the ferrule so that the region of the optical fiber at which the optical fiber Bragg grating is formed and the region of the optical fiber to which the first thermal epoxy resin is applied are located in the cylindrical free space of the ferrule; fixing the optical fiber to the ferrule by curing the first thermal epoxy resin; and optically coupling one end of the optical fiber, fixed to the ferrule, and a light source.

9 Claims, 4 Drawing Sheets

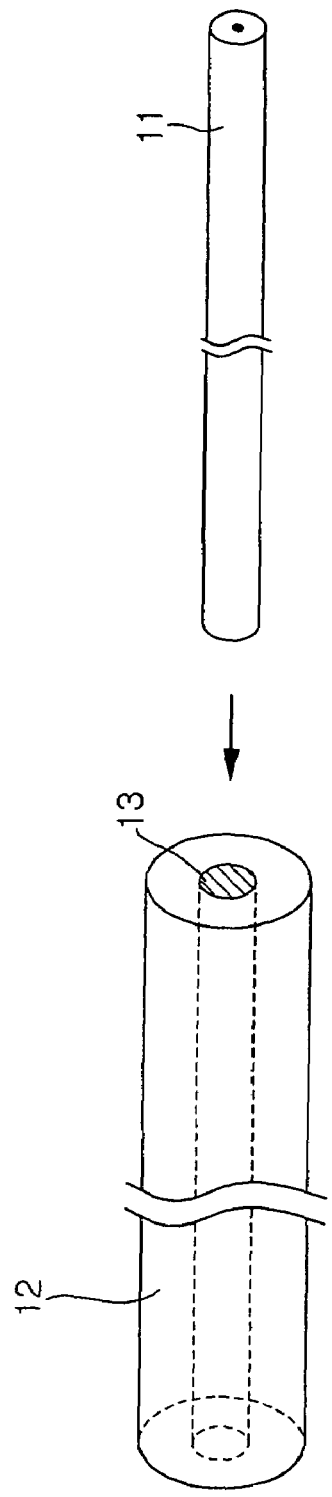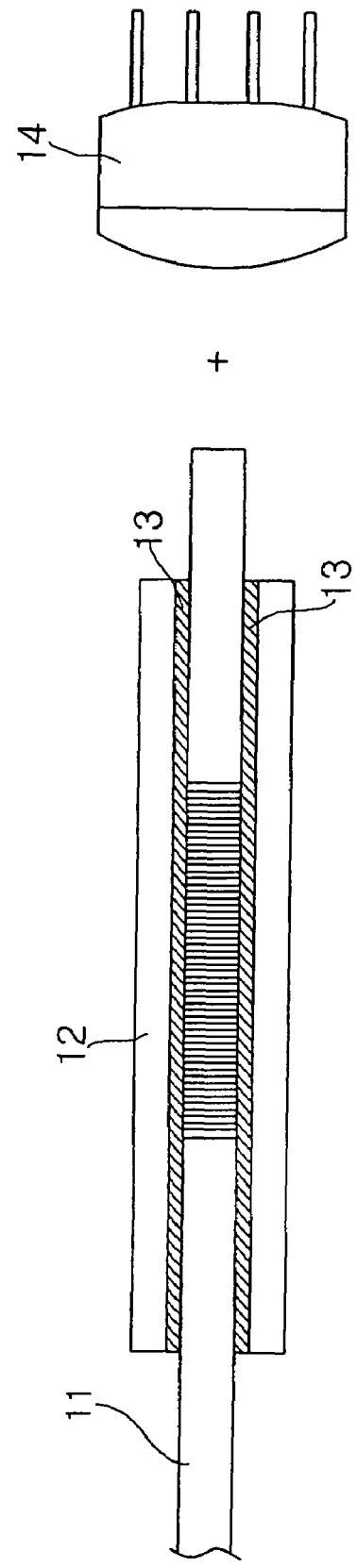
PRIOR ART
FIG. 1A
PRIOR ART
FIG. 1B

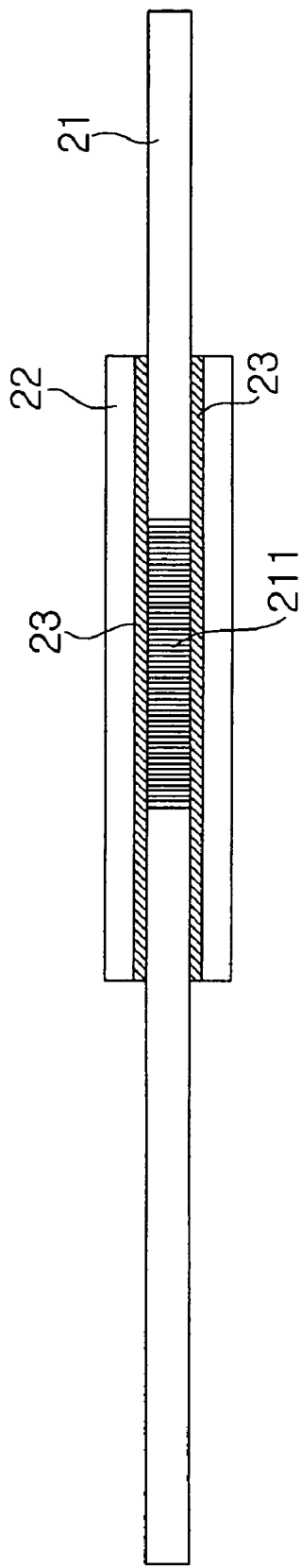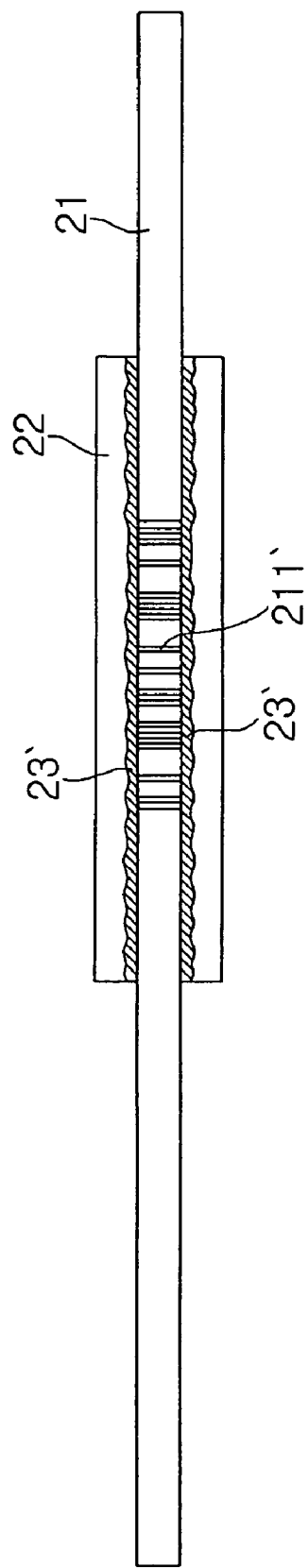
PRIOR ART
FIG. 2A
PRIOR ART
FIG. 2B

METHOD FOR FABRICATING LASER DIODE HAVING OPTICAL FIBER BRAGG GRATING AS FRONT MIRROR OF EXTERNAL RESONATOR AND LASER DIODE FABRICATED THEREBY

RELATED APPLICATIONS

The present application is based on, and claims priority from, Korean Application Number 2004-108919, filed Dec. 20, 2004, the disclosure of which is incorporated by reference herein in its entirety.

BACKGROUND OF THE INVENTION

1. Field of the Invention

The present invention relates to a method for fabricating a laser diode having an optical fiber Bragg grating as a front mirror of external resonator and a laser diode fabricated thereby, and more particularly to a method for fabricating a laser diode having an optical fiber Bragg grating as a front mirror of external resonator and a laser diode fabricated thereby, in which when an optical fiber having the optical fiber Bragg grating formed thereon is coupled to a TO-CAN packaged laser diode chip using a fiber pigtailing method, a thermal epoxy resin is applied to a designated part of the outer cylindrical surface of the optical fiber at a region, at which the optical fiber Bragg grating is not formed, is located in a ferrule, and is then cured so that variation in optical characteristics of the optical fiber Bragg grating, after the optical fiber having the optical fiber Bragg grating is mechanically fixed in the ferrule, is minimized, thereby using the optical fiber Bragg grating having a stabilized oscillation frequency as front mirror of the external resonator.

2. Description of the Related Art

Generally, a laser diode having an optical fiber Bragg grating as a front mirror of external resonator improves stability of an oscillation frequency due to temperature and injected current by placing the optical fiber Bragg grating serving as a front mirror at a light output terminal.

Since the external resonating laser diode using the above optical fiber Bragg grating as a front mirror of external resonator employs an optical fiber made of silica having excellent temperature stability, the laser diode has an excellent output frequency stability according to variation in injected current or external temperature compared to a Fabry-Perot laser, a Distributed Feedback (DFB) laser, and a Distributed Bragg Reflector (DBR) laser. Further, since the optical fiber Bragg grating is used as the front mirror of the external resonator, it is possible to embody lasers having various objects according to optical characteristics of the optical fiber Bragg grating and it is easy to select and control an oscillation frequency. Particularly, since the stability of the oscillation frequency is excellent, it is unnecessary to additionally control temperature, thereby reducing the production costs of the laser.

In fabrication of the laser using the above optical fiber Bragg grating as the front mirror of the external resonator, it is important to fabricate the laser without changing optical characteristics of the optical fiber Bragg grating serving as the front mirror of the external resonator. In order to form a optical coupling between optical fiber and a TO-CAN packaged laser diode module, a cylindrical free space located in a ferrule is filled with a thermal epoxy resin, the optical fiber is inserted into the ferrule, and the thermal epoxy resin is cured so that the optical fiber is fixed to the ferrule. FIGS. 1A and 1B illustrate a conventional process for fabricating the above laser.

With reference to FIG. 1A, in order to form optical coupling between optical fiber and a TO-CAN packaged laser diode chip, in the conventional process for fabricating the laser, an optical fiber 11 is fixedly inserted into a cylindrical-structured ferrule 12. In this process, a cylindrical free space is formed through the ferrule 12 along the longitudinal direction, and is filled with a thermal epoxy resin 13. When the optical fiber 11 is inserted into the ferrule 12 filled with the thermal epoxy resin 13, and is heated, the thermal epoxy resin 13 is cured, thereby fixing the optical fiber 11 to the ferrule 12 under the condition that the optical fiber 11 is inserted into the ferrule 12. Thereafter, as shown in FIG. 1B, under the condition that the optical fiber 11 is fixedly inserted into the ferrule 12, the ferrule 12, to which the optical fiber 11 is fixed, and a TO-CAN packaged laser diode chip 14 are optically coupled, thereby producing a laser.

In the above conventional method for fabricating the laser, since the cylindrical free space formed through the ferrule 12 is filled with the thermal epoxy resin 13 and then the optical fiber 11 is inserted into the ferrule 12, as shown in FIG. 1B, the overall outer cylindrical surface of the optical fiber 11 inserted into the ferrule 12 is fixed by the thermal epoxy resin 13. In the above conventional method, when the thermal epoxy resin 13 filling the cylindrical free space located in the ferrule 12 is cured, fine strain is applied to the optical fiber 11 inserted into the ferrule 12. The applied strain does not comparatively affect optical characteristics of a conventional single mode optical fiber, but changes reflectance spectrum characteristics of an optical fiber having an optical fiber Bragg grating having wavelength selectivity. FIGS. 2A and 2B are schematic views illustrating problems generated from the optical fiber having the Bragg grating formed thereon due to the conventional process for fabricating the laser.

As shown in FIG. 2A, a cylindrical free space formed through a ferrule 22 is filled with a thermal epoxy resin 23, and an optical fiber 21 having an optical fiber Bragg grating 211 formed thereon is inserted into the ferrule 22. A region of the optical fiber 21, at which the Bragg grating 211 is formed, is located in the ferrule 22, and the thermal epoxy resin 23 is located at the overall outer cylindrical surface of the optical fiber 21 inserted into the ferrule 22 according to the conventional method. In this state, when the optical fiber 21 is heated using a heater so as to be fixed to the ferrule 22, the thermal epoxy resin 23 is cured.

In the above process, as shown in FIG. 2B, the thermal epoxy resin 23 is cured by heating so that irregularly distributed thermal epoxy resin 23' is obtained. Then, when the optical fiber 21 and the ferrule 22 are mechanically fixed to each other, the characteristics of optical fiber Bragg grating 211 is changed. That is, when the optical fiber 21 having the optical fiber Bragg grating 211 formed thereon is fixed to the cylindrical free space located in the ferrule 22, strain is applied to the optical fiber 21 due to the irregular curing of the thermal epoxy resin 23, thereby changing the Bragg grating 211 having uniform period in sub micrometer unit to the irregular fiber Bragg grating 211' having uniform period. Then, the change of the period in the fiber Bragg grating has a negative effect on a reflection spectrum of the optical fiber Bragg grating.

That is, since the Bragg resonance frequency of the optical fiber Bragg grating is changed by the strain generated when the thermal epoxy resin is cured, an oscillation frequency of the fabricated laser is outputted from a frequency region differing from a designed frequency region. Particularly, when the reflectance of the optical fiber Bragg grating is changed, the resonance does not occur, thereby not generating optical output of the laser.

SUMMARY OF THE INVENTION

Therefore, the present invention has been made in view of the above problems, and it is an object of the present invention to provide a method for fabricating a laser having an optical fiber Bragg grating as a front mirror of external resonator, which prevents variation in optical characteristics of the optical fiber Bragg grating when the laser is fabricated, thereby stabilizing optical output and improving stability in an oscillation frequency.

It is another object of the present invention to provide a method for fabricating a laser having an optical fiber Bragg grating as a front mirror of external resonator, which reduces a quantity of a thermal epoxy resin to be consumed for fixing an optical fiber having the optical fiber Bragg grating formed thereon and a ferrule so that a heat treatment time for curing the thermal epoxy resin is shortened, thereby shortening an overall fabrication time.

It is yet another object of the present invention to provide a laser fabricated by the above method.

In accordance with one aspect of the present invention, the above and other objects can be accomplished by the provision of a method for fabricating a laser having an optical fiber Bragg grating as a front mirror of external resonator comprising: preparing an optical fiber including the optical fiber Bragg grating formed at a region thereof, and a ferrule provided with a cylindrical free space penetrating both ends thereof; applying a first thermal epoxy resin to a partial region of the outer cylindrical surface of the other region of the optical fiber, at which the optical fiber Bragg grating is not formed; inserting the optical fiber into the ferrule so that the region of the optical fiber at which the optical fiber Bragg grating is formed and the region of the optical fiber to which the first thermal epoxy resin is applied are located in the cylindrical free space located in the ferrule; fixing the optical fiber to the ferrule by curing the first thermal epoxy resin; and optically coupling one end of the optical fiber, fixed to the ferrule, and a light source.

Preferably, the method may further comprise preparing a tube provided with a cylindrical free space penetrating both ends thereof; filling the cylindrical free space of the tube with a second thermal epoxy resin, and applying yet a third thermal epoxy resin to one end of the tube; inserting the other end of the optical fiber, connected to the light source, into the tube so that the end of the tube to which the third thermal epoxy resin is applied and one end of the ferrule are bonded; and fixing the optical fiber to the inside of the tube and fixing the tube and the ferrule to each other by curing the second and third thermal epoxy resins.

Further, preferably, the optical coupling between the optical fiber and the light source may include cutting one end of the optical fiber fixed to the ferrule to have a designated length, and grinding the cut end of the optical fiber; preparing a package sleeve provided with one end, to which the TO-CAN packaged laser diode chip is connected; fixing the ferrule to the other end of the package sleeve by a laser welding method so that light irradiated from the TO-CAN packaged laser diode chip is incident on the ground end of the optical fiber; and surrounding the outer cylindrical surface of the ferrule with a boot made of rubber.

Moreover, preferably, in the insertion of the optical fiber into the ferrule, the region of the optical fiber, at which the optical fiber brag grating is formed, may be inserted into the ferrule ahead of the region of the optical fiber, to which the first thermal epoxy resin is applied, and the light source may be a TO-CAN packaged laser diode chip.

In accordance with another aspect of the present invention, there is provided a laser having an optical fiber Bragg grating as a front mirror of external resonator comprising: a ferrule provided with a cylindrical free space penetrating both ends thereof; an optical fiber fixedly inserted into the ferrule and including the optical fiber Bragg grating formed at a designated region thereof, which is inserted into the cylindrical free space; a light source optically coupled to one end of the optical fiber; and a tube disposed at the other end of the optical fiber connected to the light source, and provided with a cylindrical free space penetrating both ends thereof, into which the optical fiber is inserted, and one end fixed to one end of the ferrule, wherein the optical fiber is fixed to the cylindrical free space of the ferrule by a first thermal epoxy resin applied to a partial region of the outer cylindrical surface of the optical fiber at the other region, at which the optical fiber Bragg grating is not formed, and is fixed to the cylindrical free space of the tube by a second thermal epoxy resin, and the tube and the ferrule are fixed to each other by a third thermal epoxy resin.

BRIEF DESCRIPTION OF THE DRAWINGS

The above and other objects, features and other advantages of the present invention will be more clearly understood from the following detailed description taken in conjunction with the accompanying drawings, in which:

FIGS. 1A and 1B are schematic views illustrating a conventional process for fabricating a laser;

FIGS. 2A and 2B are schematic views illustrating problems generated from the conventional process;

DESCRIPTION OF THE PREFERRED EMBODIMENTS

Now, a method for fabricating a laser having an optical fiber Bragg grating as a front mirror of external resonator and a laser fabricated thereby in accordance a preferred embodiment of the present invention will be described in detail with reference to the annexed drawings.

FIGS. 3A to 3D are sectional views illustrating a process for fabricating a laser having an optical fiber Bragg grating as a front mirror of external resonator in accordance with an embodiment of the present invention.

Figure 3A:
FIGS. 3A to 3D are sectional views illustrating a process for fabricating a laser having an optical fiber Bragg grating as a front mirror of external resonator in accordance with an embodiment of the present invention.

In the process for fabricating a laser having an optical fiber Bragg grating as a front mirror of external resonator in accordance with an embodiment of the present invention, first, as shown in FIG. 3A, an optical fiber 31, in which an optical fiber Bragg grating 311 is formed at a region, and a ferrule (not shown), through which a cylindrical free space is formed in the longitudinal direction, are prepared. The optical fiber Bragg grating 311 is formed at the region of the optical fiber 31, and serves as a front mirror. By locating the optical fiber Bragg grating 311 at the region of the optical fiber 31, stability in an oscillation frequency of the laser due to temperature and injected current is improved. The ferrule (not shown) conventionally has a cylindrical structure such that a cylindrical free space penetrates both ends of the ferrule in the longitudinal direction. Later, the optical fiber 31 will be inserted later into the ferrule.

Figure 3B:
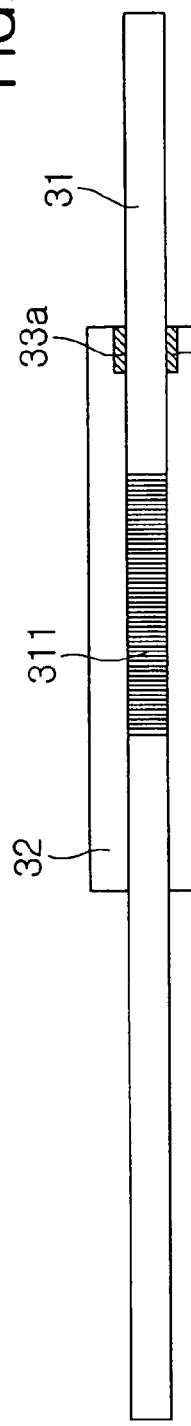

Thereafter, as shown in FIG. 3B, a thermal epoxy resin 33*a* is applied to a designated part of the outer cylindrical surface of the region of the optical fiber 31, at which the optical fiber Bragg grating 311 is not formed. The thermal epoxy resin 33*a* serves to fix the optical fiber into the ferrule 32, and is cured by heating. In order to prevent strain, generated from the curing of the thermal epoxy resin 33*a*, from affecting the the period in the optical fiber Bragg grating 311, the thermal epoxy resin 33*a* is not formed on the outer cylindrical surface of the region of the optical fiber 31, at which the optical fiber Bragg grating 311 is formed, but is formed on the outer cylindrical surface of the other region of the optical fiber 31.

As described above, the optical fiber 31, in which the thermal epoxy resin 33*a* is applied to the designated part of the outer cylindrical surface of the region thereof, at which the optical fiber Bragg grating 311 is not formed, is inserted into the ferrule 32. Here, preferably, the region of the optical fiber 31, at which the optical fiber Bragg grating 311 is formed, is inserted into the ferrule 32 ahead of the region of the optical fiber 31, at which the epoxy resin 33*a* is applied. In the case that the region of the optical fiber 31, at which the epoxy resin 33*a* is applied, is inserted into the ferrule 32 ahead of the region of the optical fiber 31, at which the optical fiber Bragg grating 311 is formed, the epoxy resin 33*a* sticks to the cylindrical free space located in the ferrule 32, thereby deteriorating bonding force, by which the optical fiber 31 is fixed to the ferrule 32, when the epoxy resin 33*a* is heated. Particularly, the epoxy resin 33*a* may exist at the region of the optical fiber 31, at which the optical fiber Bragg grating 311 is formed, and change the period in the optical fiber Bragg grating 311 due to strain generated by the curing of the epoxy resin 33*a* when the epoxy resin 33*a* is heated.

After the optical fiber 31 is inserted into the ferrule 32, the epoxy resin 33*a* is cured by heating using a heater so that the optical fiber 31 and the ferrule 32 are fixed to each other. The above heating step may be performed simultaneously with a step of curing a thermal epoxy resin in a process for fixing the optical fiber 31 using an additional tube.

Figure 3C:
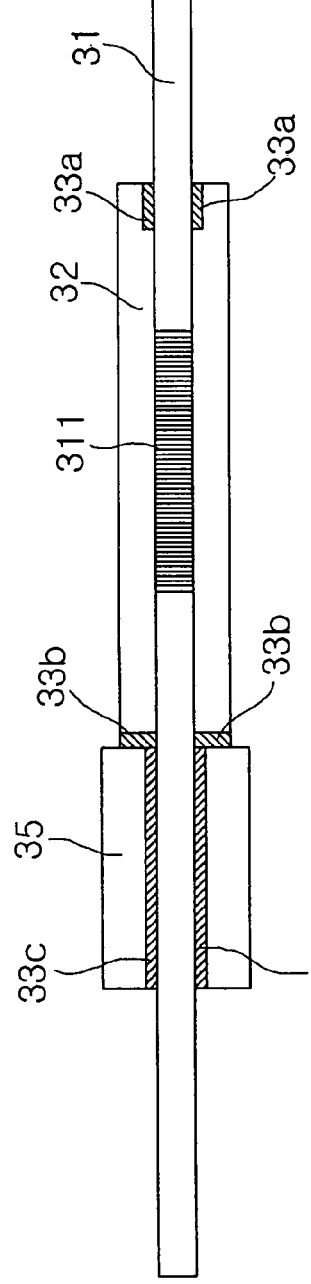

Thereafter, as shown in FIG. 3C, a tube 35 provided with a cylindrical free space penetrating both ends thereof is prepared, the cylindrical free space of the tube 35 is filled with a thermal epoxy resin 33*c*, and a thermal epoxy resin 33*b* is applied to one end of the tube 35. The optical fiber 31 is inserted into the tube 35, and the end of the tube 35, to which the thermal epoxy resin 33*b* is applied, is bonded to one end of the ferrule 32. Then, the thermal epoxy resins 33*b* and 33*c* are cured so that the optical fiber 31 is fixed to the inside of the tube 35, and the tube 35 and the ferrule 32 are fixed to each other.

In the step of fixing the optical fiber 31 and the ferrule 32 to each other as shown in FIG. 3B, since the thermal epoxy resin 33*a* is applied to the region of the outer cylindrical surface of the optical fiber 31, differing from the conventional method, the bonding force between the optical fiber 31 and the ferrule 32 may be deteriorated. In order to compensate for the deteriorated bonding force, the additional tube 35 is prepared, thus fixing the optical fiber 31. The tube 35 is made of stainless steel, and is provided with the cylindrical free space penetrating both ends thereof in the same manner as the ferrule 32 so that the optical fiber 31 is inserted into the tube 35.

After the cylindrical free space of the tube 35 is filled with the thermal epoxy resin 33*c*, the optical fiber 31 is inserted into the tube 35. Accordingly, the thermal epoxy resin 33*c* surrounds the whole area of the region of the optical fiber 31, which is inserted into the tube 35, thereby improving the bonding force. Since the optical fiber Bragg grating 311 is not located at the region of the optical fiber 31, which is inserted into the tube 35, although the thermal epoxy resin 33*c* surrounds the whole area of the above region of the optical fiber 31, the thermal epoxy resin 33*c* does not affect the period in the optical fiber Bragg grating 311.

Further, the thermal epoxy resin 33*b* is applied to one end of the tube 35 so as to fix the end of the tube 35 to one end of the ferrule 32, thereby improving mechanical bonding force between the tube 35 and the ferrule 32.

The thermal epoxy resin 33*c* filling the cylindrical free space of the tube 35 for fixing the optical fiber 31 to the cylindrical free space of the tube 35 and the thermal epoxy resin 33*b* applied to one end of the tube 35 for fixing one end of the ferrule 32 to the end of the tube 35 are cured by heating using a heater. This curing step may be performed simultaneously with the curing step of the thermal epoxy resin 33*a* used for fixing the optical fiber 31 and the ferrule 32 to each other as shown in FIG. 3B.

Figure 3D:
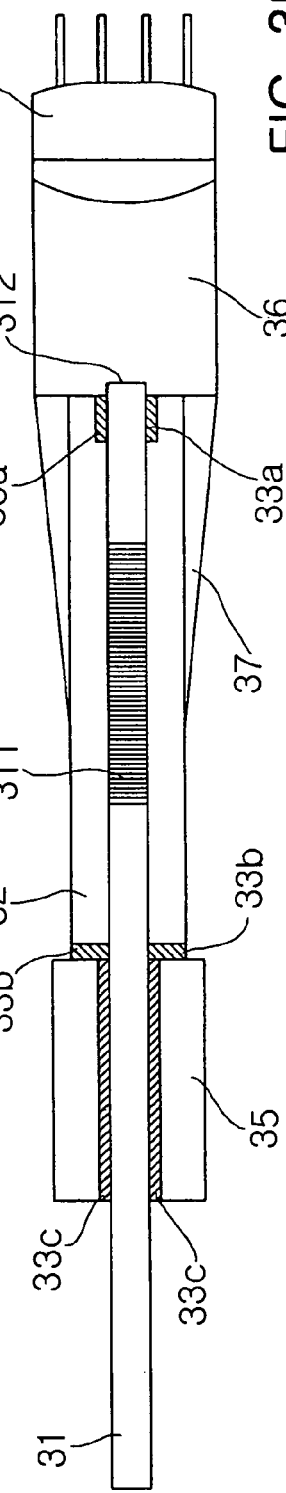

Thereafter, as shown in FIG. 3D, one end 312 of the optical fiber 31, fixed to the ferrule 32, and a light source are optically coupled, thereby completing the fabrication of a laser having an optical fiber Bragg grating as a front mirror of external resonator. Preferably, the light source is a TO-CAN packaged laser diode chip 34. The TO-CAN packaged laser diode chip 34 includes a semiconductor laser diode, a monitoring optical detector, and an aspherical lens cap. Since the TO-CAN packaged laser diode chip 34 is optically coupled to the end 312 of the optical fiber 31, light generated from the semiconductor laser diode of the TO-CAN packaged laser diode chip 34 is incident on the optical fiber 31, and light having a designated wavelength corresponding to a Bragg resonance frequency is returned to the TO-CAN packaged laser diode chip 34 through the optical fiber Bragg grating 311 formed on the optical fiber 31. The returned light having the above wavelength obtains proper gain in the semiconductor laser diode, and is then oscillated. The light having wavelengths other than the above wavelength corresponding to the Bragg resonance frequency is not returned to the TO-CAN packaged laser diode chip 34, and is attenuated without obtaining gain.

In order to optically couple the optical fiber 31 and the TO-CAN packaged laser diode chip 34 serving as the light source, the end 312 of the optical fiber 31 fixed to the ferrule 32 is cut to have a designated length and is ground, a package sleeve 36, to which the TO-CAN packaged laser diode chip 34 is connected, is provided on the ground end 312, and then the ferrule 32 is fixed to one end of the package sleeve 36 so that the light irradiated from the TO-CAN packaged laser diode chip 34 is incident on the ground end 312 of the optical fiber 31.

Since the optical fiber 31 is fixed to the ferrule 32 under the condition that the length of the optical fiber 31 is not adjusted, the optical fiber 31 must be cut to have a proper length to obtain a distance from the TO-CAN packaged laser diode chip 34 for the optical coupling between the optical fiber 31 and the TO-CAN packaged laser diode chip 34. Preferably, the cut end of the optical fiber 31 is ground using a grinder so that the cut end is flat to facilitate the optical coupling between the optical fiber 31 and the TO-CAN packaged laser diode chip 34.

Preferably, a laser welding method is used to fix the ferrule 32 to the package sleeve 36.

Further, in the step of optically coupling the optical fiber 31 and the TO-CAN packaged laser diode chip 34 serving as the light source, a boot 37 made of rubber surrounds the outer cylindrical surface of the ferrule 32.

Although, in the preferred embodiment of the present invention as described above, the step of fixing the optical fiber 31 to the tube 35 is performed prior to the step of optically coupling the optical fiber 31 and the light source, those skilled in the art will appreciate that the order of the two steps may be changed. Accordingly, the order of the two steps does not limit the present invention.

As described above, in the method for fabricating the laser having the optical fiber Bragg grating as the front mirror of the external resonator in accordance with the present invention, in the step for fixing the optical fiber 31 to the ferrule 32, since the thermal epoxy resin 33a for fixing the optical fiber 31 is not positioned at the region of the optical fiber 31, at which the optical fiber Bragg grating 311 is formed, thus not deteriorating the period in and reflectance characteristics of the optical fiber Bragg grating 311 due to strain generated when the thermal epoxy resin 33a is cured. Accordingly, it is possible to stabilize optical output of the laser and improve stability of an oscillation frequency of the laser.

The present invention further provides a laser fabricated by the above-described method. Hereinafter, with reference to FIGS. 3C and 3D, a laser having an optical fiber Bragg grating as a front mirror of external resonator in accordance with the present invention will be described.

As shown in FIGS. 3C and 3D, the laser of the present invention comprises the ferrule 32 provided with the cylindrical free space penetrating both ends thereof, the optical fiber 31 fixedly inserted into the ferrule 32 and including the optical fiber Bragg grating 311 formed at a designated region thereof inserted into the cylindrical free space, the light source optically coupled to the end 312 of the optical fiber 31, and the tube 35 disposed at the other end of the optical fiber 31 connected to the light source 34, and provided with the cylindrical free space penetrating both ends thereof, into which the optical fiber 31 is inserted, and one end thereof fixed to one end of the ferrule 32. In the above laser, the optical fiber 31 is fixed to the cylindrical free space of the ferrule 32 by the thermal epoxy resin 33a applied to a designated part of the outer cylindrical surface of the region of the optical fiber 31, at which the optical fiber Bragg grating 311 is not formed, and is fixed to the cylindrical free space of the tube 35 by the thermal epoxy resin 33c. The tube 35 and the ferrule 32 are fixed to each other by the thermal epoxy resin 33b.

As described in the above method for fabricating the laser having the optical fiber Bragg grating as the front mirror of the external resonator in accordance with the embodiment of the present invention, preferably, the light source is the TO-CAN packaged laser diode chip 34, and the end 312 of the optical fiber 31 optically coupled to the light source is cut to have a proper length and is ground.

The laser of the present invention further comprises the package sleeve 36, one end of which is connected to the TO-CAN packaged laser diode chip 34 and the other end of which is connected to the ferrule 32 so that light irradiated from the TO-CAN packaged laser diode chip 34 is incident on the ground end 312 of the optical fiber 31, and the boot 37 made of rubber surrounding the outer cylindrical surface of the ferrule 32.

Constitution and operation of the laser having the optical fiber Bragg grating as the front mirror of the external resonator in accordance with the present invention were already described in the method for fabricating the laser, and a detailed description thereof will thus be omitted because it is considered to be unnecessary.

Figure 4:
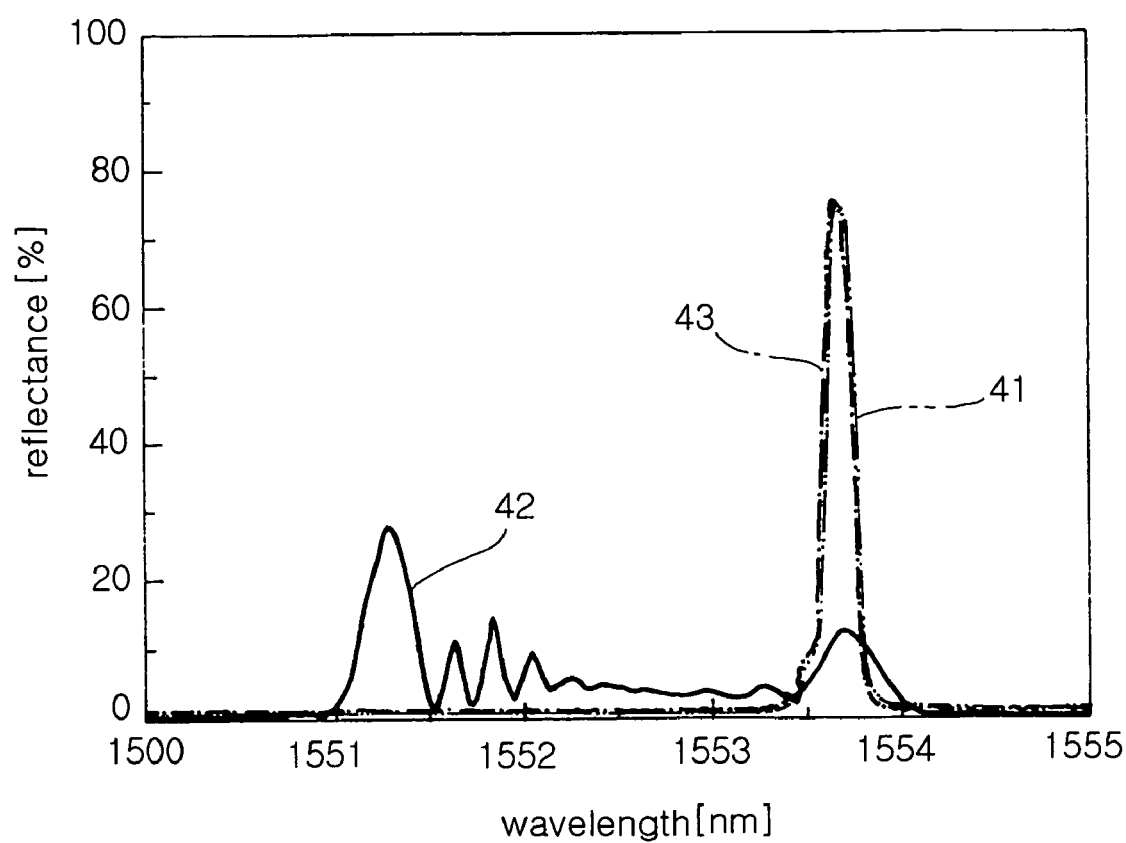
FIG. 4 is a graph of optical spectra comparatively illustrating reflection characteristics of the conventional laser and the laser of the present invention.

FIG. 4 is a graph of optical spectra comparatively illustrating reflection characteristics of the conventional laser and the laser of the present invention.

In FIG. 4, a two-dot chain line denoted by reference numeral 41 indicates a reflectance spectrum of an optical fiber Bragg grating formed on an optical fiber, a full line denoted by reference numeral 42 indicates a reflectance spectrum of the optical fiber Bragg grating of the conventional laser, and a one-dot chain line denoted by reference numeral 43 indicates a reflectance spectrum of the optical fiber Bragg grating of the laser of the present invention.

As shown in FIG. 4, it is known that the reflectance spectrum of the optical fiber Bragg grating of the conventional laser has a large error compared to the reflectance spectrum of the optical fiber Bragg grating formed on the optical fiber prior to fabricating a laser. That is, the conventional laser generates strain due to the curing of thermal epoxy resin for fixing the optical fiber to the ferrule, and deteriorates the period in and reflectance characteristics of the optical fiber Bragg grating, thereby not reflecting light at a desired wavelength band. Accordingly, since resonance does not occur at the corresponding wavelength, the conventional laser does not emit light. On the other hand, the laser of the present invention has approximately the same reflectance spectrum as that of the optical fiber Bragg grating formed on the optical fiber prior to fabricating the laser. That is, the laser of the present invention does not deteriorate the period in and reflectance characteristics of the optical fiber Bragg grating, thereby generating light at a desired wavelength.

As apparent from the above description, the present invention provides a method for fabricating a laser having an optical fiber Bragg grating as a front mirror of external resonator and a laser fabricated thereby, in which a thermal epoxy resin for fixing an optical fiber to a ferrule is not formed at a region of the optical fiber, at which the optical fiber Bragg grating is formed, thereby preventing deterioration of optical characteristics of the optical fiber Bragg grating due to the curing of the thermal epoxy resin.

In accordance with the present invention, since the optical characteristics of the optical fiber Bragg grating are maintained, it is possible to easily estimate an oscillation wavelength of the laser.

In accordance with the present invention, since a quantity of the thermal epoxy resin consumed to fabricate the laser is reduced, it is possible to shorten a time taken to cure the thermal epoxy resin, thus shortening an overall fabrication time of the laser.

Although the preferred embodiment of the present invention has been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a laser having an optical fiber Bragg grating as a front mirror of external resonator comprising:

preparing an optical fiber including the optical fiber Bragg grating formed at a region thereof, and a ferrule provided with a cylindrical free space penetrating both ends thereof;

applying a first thermal epoxy resin to a partial region of the outer cylindrical surface of the other region of the optical fiber, at which the optical fiber Bragg grating is not formed;

inserting the optical fiber into the ferrule so that the region of the optical fiber at which the optical fiber Bragg grating is formed and the region of the optical fiber to which the first thermal epoxy resin is applied are located in the cylindrical free space of the ferrule;

fixing the optical fiber to the ferrule by curing the first thermal epoxy resin;

optically coupling one end of the optical fiber, fixed to the ferrule, and a light source;

preparing a tube provided with a cylindrical free space penetrating both ends thereof;

filling the cylindrical free space of the tube with a second thermal epoxy resin, and applying yet a third thermal epoxy resin to one end of the tube;

inserting the other end of the optical fiber, connected to the light source, into the tube so that the end of the tube to which the third thermal epoxy resin is applied and one end of the ferrule are bonded; and fixing the optical fiber to the inside of the tube and fixing the tube and the ferrule to each other by curing the second and third thermal epoxy resins.

2. The method as set forth in claim 1, further comprising:

surrounding an outer cylindrical surface of the ferrule with a boot; and connecting a package sleeve to the ferrule and the light source.

3. The method as set forth in claim 1, wherein in the insertion of the optical fiber into the ferrule, the region of the optical fiber, at which the optical fiber Bragg grating is formed, is inserted into the ferrule ahead of the region of the optical fiber, to which the first thermal epoxy resin is applied.

4. The method as set forth in claim 1, wherein the light source is a TO-CAN packaged laser diode chip.

5. The method as set forth in claim 4, wherein the optical coupling between the optical fiber and the light source includes:

cutting one end of the optical fiber fixed to the ferrule to have a designated length, and grinding the cut end of the optical fiber;

preparing a package sleeve provided with one end, to which the TO-CAN packaged laser diode chip is connected;

fixing the ferrule to the other end of the package sleeve by a laser welding method so that light irradiated from the TO-CAN packaged laser diode chip is incident on the ground end of the optical fiber; and surrounding the outer cylindrical surface of the ferrule with a boot made of rubber.

6. A laser having an optical fiber Bragg grating as a front mirror of external resonator comprising:

a ferrule provided with a cylindrical free space penetrating both ends thereof;

an optical fiber fixedly inserted into the ferrule and including the optical fiber Bragg grating formed at a designated region thereof, which is inserted into the cylindrical free space;

a light source optically coupled to one end of the optical fiber; and a tube disposed at the other end of the optical fiber connected to the light source, and provided with a cylindrical free space penetrating both ends thereof, into which the optical fiber is inserted, and one end fixed to one end of the ferrule, wherein the optical fiber is fixed to the cylindrical free space of the ferrule by a first thermal epoxy resin applied to a partial region of the outer cylindrical surface of the optical fiber at the other region, at which the optical fiber Bragg grating is not formed, and is fixed to the cylindrical free space of the tube by a second thermal epoxy resin, and the tube and the ferrule are fixed to each other by a third thermal epoxy resin.

7. The laser as set forth in claim 6, wherein the light source is a TO-CAN packaged laser diode chip.

8. The laser as set forth in claim 7, further comprising:

a package sleeve, one end of which is connected to the TO-CAN packaged laser diode chip and the other end of which is connected to the ferrule so that light irradiated from the TO-CAN packaged laser diode chip is incident on one end of the optical fiber; and a boot made of rubber surrounding the outer cylindrical surface of the ferrule.

9. The laser as set forth in claim 6, wherein the end of the optical fiber optically coupled to the light source is cut to have a designated length, and is ground.

* * * * *